United States Patent [19]

Kobayashi

[11] Patent Number: 4,853,612

[45] Date of Patent: Aug. 1, 1989

[54] RF POWER CONTROL CIRCUIT

[75] Inventor: Shinichi Kobayashi, Tokyo, Japan

[73] Assignee: NEC Corporation, Japan

[21] Appl. No.: 275,342

[22] Filed: Nov. 23, 1988

[30] Foreign Application Priority Data

Nov. 27, 1987 [JP] Japan ................................. 62-297386

[51] Int. Cl.$^4$ ............................................. G05B 24/02
[52] U.S. Cl. ..................................... 323/354; 323/297
[58] Field of Search ........................ 323/297, 354, 364

[56] References Cited

U.S. PATENT DOCUMENTS 2,999,202  9/1961  Ule ....................................... 323/354
3,273,143  9/1966  Wasserman .......................... 323/354
4,414,501 11/1983  Bedard et al. ....................... 323/354

Primary Examiner—Patrick R. Salce
Assistant Examiner—Jeffrey Sterrett
Attorney, Agent, or Firm—Laff, Whitesel, Conte & Saret

[57] ABSTRACT

An RF power control circuit for dividing a DC voltage by a plurality of resistors, selecting one of the partial voltages, and using the selected voltage as a reference voltage, thereby obtaining a multilevel RF output, has first and second switching circuits, controlled by an identical selection signal, each for selecting one of the partial voltages obtained by the resistors and outputting the selected voltage, and a selecting circuit for selecting one of outputs from the first and second switching circuits in accordance with a control signal.

3 Claims, 3 Drawing Sheets

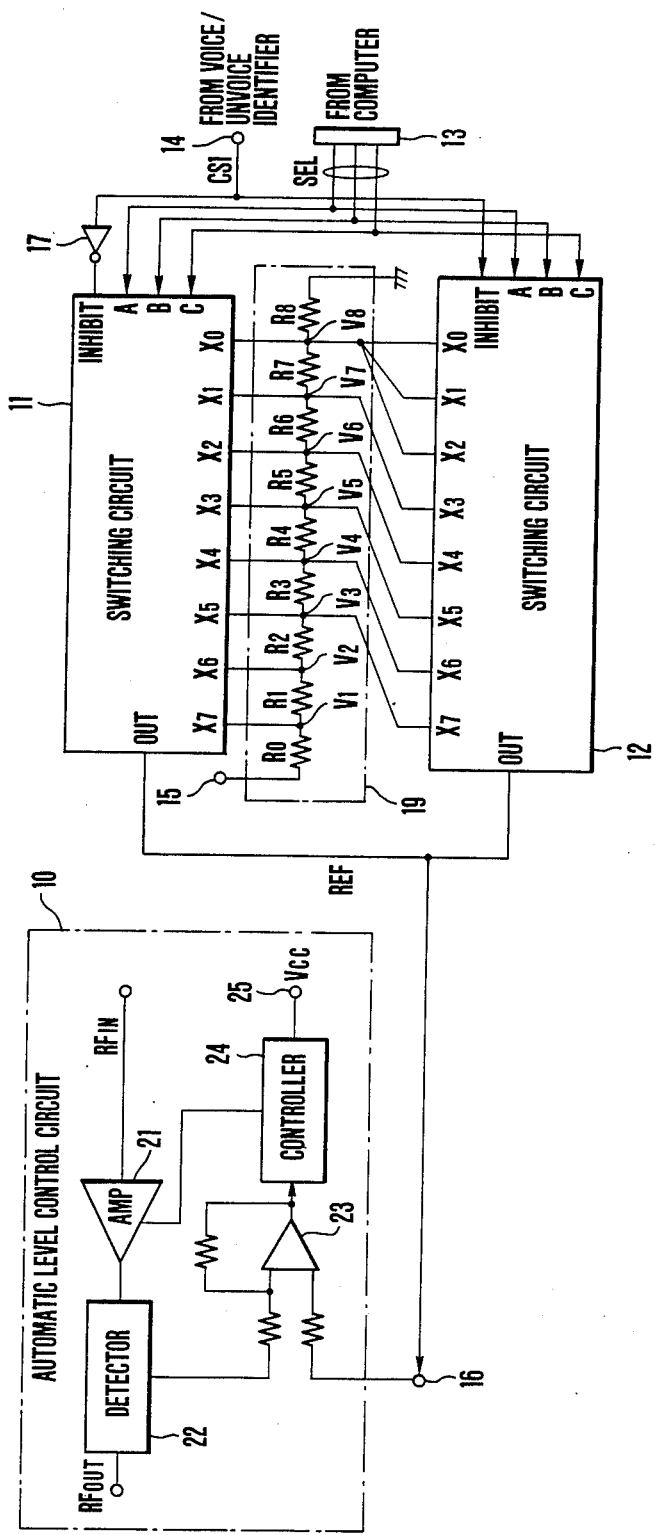
F I G. 2

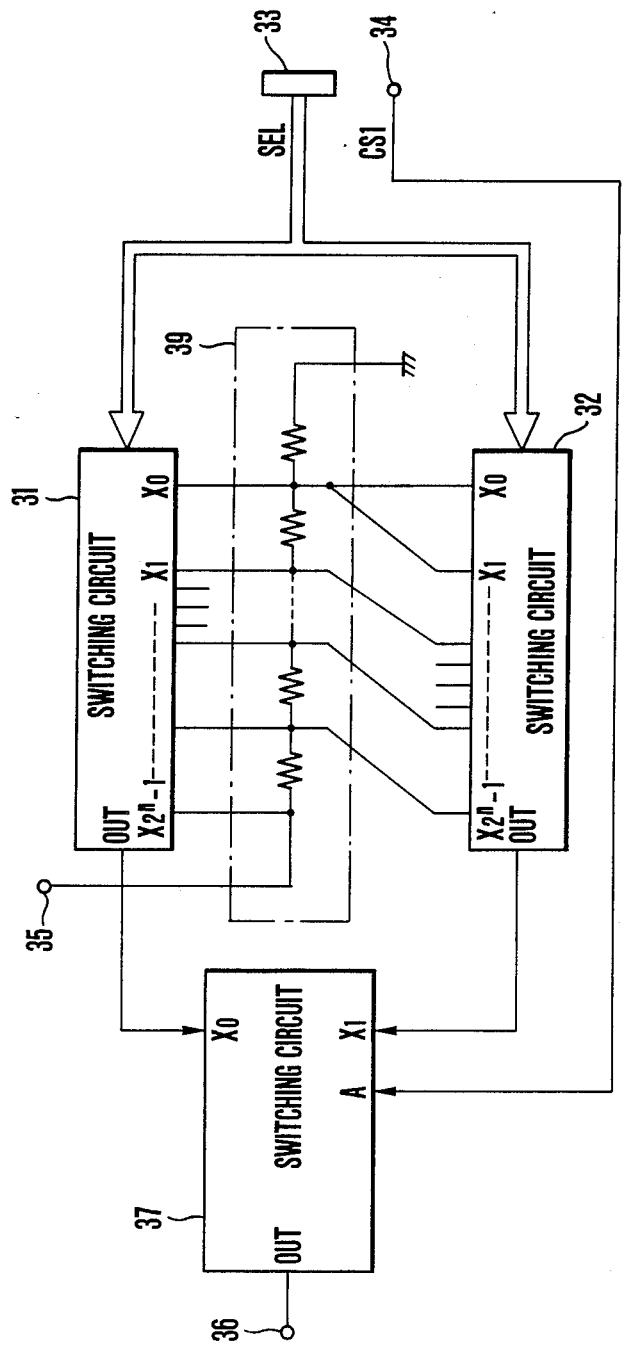
F I G. 3

RF POWER CONTROL CIRCUIT

BACKGROUND OF THE INVENTION

The present invention relates to an RF power control circuit of a radio communication device and, more particularly, to an RF power control circuit capable of controlling its transmission power in an unvoice interval of a transmission voice input.

Recently, as radio devices have been made compact and handy, devices driven by a battery have been increasingly manufactured. One of important factors of a portable radio device is a service life of a battery. The service life largely depends on power consumption during transmission.

In order to reduce power consumption to effectively use a battery, some control circuits control such that transmission is performed in only a voice interval of a transmission voice and transmission power is reduced or stopped in an unvoice interval, thereby suppressing power consumption.

In a mobile telephone system used in the North America or England, a control circuit is used to control such that a mobile device always maintains proper transmission power by a command sent from a base station.

FIG. 1 shows a typical conventional control circuit of the latter. In FIG. 1, in accordance with an n-bit selection signal SEI, supplied from a computer 3, a switching circuit 1 selects one of $2^n$ DC voltages obtained by dividing a DC voltage applied to a terminal 5 by resistors 9 and outputs a reference voltage REF for power control from an output terminal 6.

In order to easily realize the above two types of control circuits, a control signal CS1 representing the presence/absence of a transmission voice and a transmission power control signal CS2 received by a radio receiver 7 from a base station are processed by software of a computer 3 to be converted into the selection signal SEL. The switching circuit 1 is controlled by the selection signal SEL to obtain the reference voltage REF at the output terminal 6.

The above conventional RF power control circuits, however, have the following problems.

That is, the control signal CS1 depends on only the presence/absence of a transmission voice and is completely independent of the transmission power control signal CS2 from the base station. For this reason, since the two independent signals CS1 and CS2 must be processed, a processing amount of the software of the computer 3 is increased.

In addition, the computer 3 shown in FIG. 1 performs user interface processing, i.e. checks whether a volume key, a mute key or a conversation end key is depressed and performs certain processing if any key is depressed. Then, the computer 3 performs connection sequence processing for transmitting/receiving signals with respect to the base station, checks whether a command for starting a test mode is input, and if the command is input, performs a test sequence for starting the test mode. Thereafter, the computer 3 returns to the user interface processing. This cycle is repeatedly performed, and each cycle requires several 10 msec. In addition, these processing programs have priority over other programs and no interruption can be made. Therefore, the control signal CS1 from a voice/unvoice identifier 4 can be processed only after the programs are ended (or before the programs are started). For this reason, in the worst case, the n-bit selection signal SEL cannot be output before several 10 msec pass. A man, however, can recognize a voice interruption of 1 msec. That is, if the selection signal SEL is delayed by several 10 msec, a head of a voice is cut.

SUMMARY OF THE INVENTION

The present invention has been made in consideration of the above situation and has as its object to provide an RF power control circuit which can reduce a processing amount of software and can therefore reduce a processing time so that a head of a voice is not cut.

In order to achieve the above object of the present invention, there is provided an RF power control circuit for dividing a DC voltage by a plurality of resistors, selecting one of the partial voltages, and using the selected voltage as a reference voltage, thereby obtaining a multilevel RF output, comprising first and second switching circuits, controlled by an identical selection signal, each for selecting one of the partial voltages obtained by the resistors and outputting the selected voltage, and selecting means for selecting one of outputs from the first and second switching circuits in accordance with a control signal.

BRIEF DESCRIPTION OF THE DRAWINGS

FIG. 2 is a block diagram showing an embodiment of the present invention; and

FIG. 3 is a block diagram showing another embodiment of the present invention.

DETAILED DESCRIPTION OF THE PREFERRED EMBODIMENTS

Figure 1:
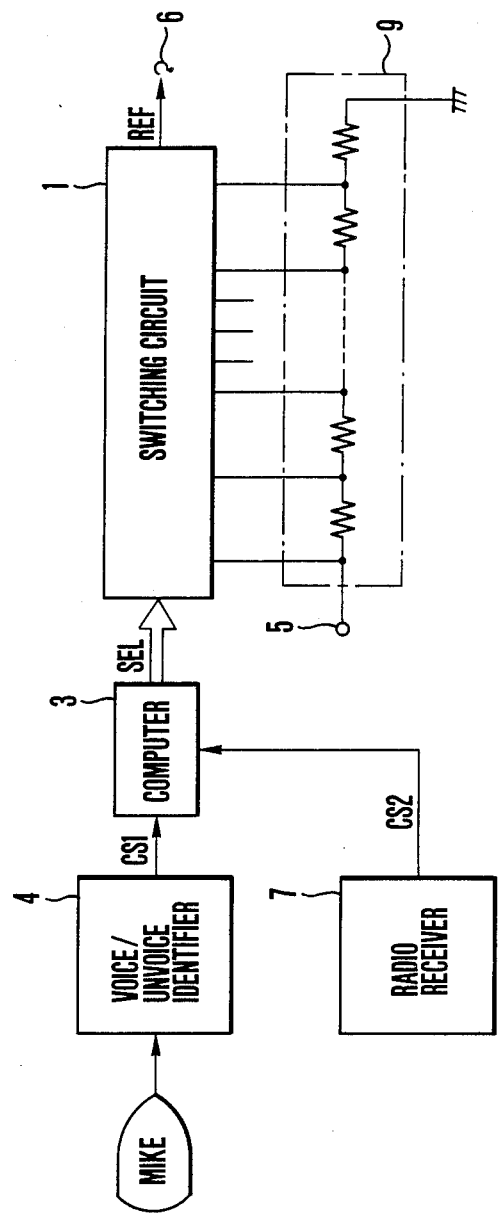
FIG. 1 is a block diagram showing a conventional technique.

Embodiments of the present invention will be described below with reference to the accompanying drawings.

FIG. 2 is a block diagram showing an arrangement of an embodiment of an RF power control circuit according to the present invention.

In FIG. 2, each of switching circuits 11 and 12 is, for example, a μPD-4051BC (tradename) available from NEC CORP. Identical 3-bit selection signals SEL are supplied from a computer (not shown) to terminals A, B and C of the switching circuit 11 (12) through an input terminal 13. The switching circuit 11 (12) has eight input terminals $X_0$ to $X_7$ and selects and connects one of the input terminals $X_0$ to $X_7$ to an output terminal OUT in accordance with the value of the 3-bit selection signal SEL. When a signal of low level is supplied to a terminal INHIBIT, the switching circuit 11 (12) operates; when a signal of high level is supplied thereto, the switching circuit 11 (12) stops a selection operation and the output terminal OUT is opened.

A control signal CS1 is supplied from a voice/unvoice identifier (not shown) to the terminal INHIBIT of the switching circuit 11 through an inverter 17 and directly to that of the switching circuit 12. That is, regardless of the logic level of the control signal CS1, an operation of either the switching circuit 11 or 12 is stopped.

A DC voltage applied to a terminal 15 is divided into partial voltages $V_1$ to $V_8$ by voltage-dividing resistors 19. The partial voltages $V_1, V_2, \ldots V_8$ are applied to the input terminals $X_7, X_6, \ldots X_0$ of the switching circuit 11, respectively. The voltages $V_3, V_4, V_5, V_6$ and $V_7$ are applied to the input terminals $X_7$, $X_6$, $X_5$, $X_4$ and $X_3$ of the switching circuit 12, respectively. The voltage $V_8$ is applied to the input terminals $X_2$, $X_1$ and $X_0$ of the switching circuit 12.

The output terminals OUT of the switching circuits 11 and 12 are connected to a common output terminal 16. A reference voltage REF from the output terminal 16 is applied as a control signal to an automatic level control (ALC) circuit 10.

The ALC circuit 10 may be a circuit which is conventionally used. Generally, the level of an RF input signal $RF_{IN}$ supplied to an amplifier 21 varies in accordance with fluctuations in a power source voltage, a temperature or a difference between individual devices. Therefore, the level of an output voltage $RF_{OUT}$ detected by a detector 22 for detecting an output from the amplifier 21 varies. In order to prevent this variation, the output detected by the detector 22 is supplied to a differential amplifier 23. The reference voltage REF selected and output from the switching circuit 11 or 12 is supplied as a reference voltage to the differential amplifier 23. An output from the differential amplifier 23 is supplied to a controller 24. The controller 24 controls an input voltage $V_{CC}$ from a terminal 25 in accordance with the output voltage from the differential amplifier 23, thereby controlling the gain of the amplifier 22. As described above, the ALC circuit 10 constitutes a loop circuit for maintaining the output level of the amplifier 21.

An operation of the circuit shown in FIG. 2 will be described below.

Assume that the 3-bit selection signal SEL is (1,0,1) and the switching circuits 11 and 12 select the input terminals $X_5$. Therefore, the switching circuits 11 and 12 connect the voltages $V_3$ and $V_5$ to their output terminals OUT, respectively.

In addition, assume that the control signal CS1 goes to high level if a transmission voice is present. In this case, since the terminal INHIBIT of the switching circuit 12 goes to high level, an impedance at the terminal OUT is increased. Meanwhile, since the terminal INHIBIT of the switching circuit 11 goes to low level, the output from the switching circuit 11, i.e., the voltage $V_3$ is obtained as the reference voltage REF at the terminal 16.

When a transmission voice becomes absent, the logic of the control signal CS1 is inverted, and therefore an impedance at the terminal OUT of the switching circuit 11 is increased. As a result, the voltage $V_5$ of the switching circuit 12 is obtained as the reference voltage REF. Transmission power of the ALC circuit 10 of the radio communication device is controlled by this reference voltage REF.

In the above embodiment, the analog switches $\mu$PD4051 (tradename) each for selecting one of eight voltages in accordance with the 3-bit selection signal are used as the switching circuits 11 and 12. The present invention is, however, not limited to the above embodiment, but any switching circuit for selecting one of $2^n$ input voltages by an n-bit selection signal may be used. In this case, the circuit may be arranged such that a voltage $V_m$ ($1 \leq m \leq 2^n$) is applied to each input terminal of the switching circuit corresponding to transmission power generated when a voice is present and a voltage $V_{m-k}$ ($1 \leq m-k \leq 2^n$) is applied to each input terminal of the switching circuit corresponding to transmission power generated when no voice is present.

FIG. 3 is a block diagram showing another embodiment of the present invention.

In FIG. 3, switching circuits 31 and 32 are not inhibited but always operated by a selection signal SEL.

A control signal CS1 representing VOICE/UN-VOICE is supplied to a terminal A of a switching circuit 37.

The switching circuit 37 connects an input terminal $X_0$ or $X_1$ with an output terminal OUT in accordance with a signal supplied to the terminal A.

As has been described above, according to the present invention, a power control processing amount of software can be reduced and accordingly a processing time can be reduced, thereby realizing high-speed RF power control.

What is claimed is:

1. An RF power control circuit for dividing a DC voltage by a plurality of resistors, selecting one of the partial voltages, and using the selected voltage as a reference voltage, thereby obtaining a multilevel RF output, comprising:

first and second switching circuits, controlled by an identical selection signal, each for selecting one of the partial voltages obtained by said resistors and outputting the selected voltage; and selecting means for selecting one of outputs from said first and second switching circuits in accordance with a control signal.

2. A circuit according to claim 1, wherein said selecting means includes inhibiting means for inhibiting operation of said first or second switching circuit in accordance with logical value of the control signal.

3. A circuit according to claim 1, wherein said selecting means includes a third switching circuit for selecting one of the outputs from said first and second switching circuits in accordance with logical value of the control signal.

* * * * *